(12) United States Patent
Tu et al.

(10) Patent No.: US 12,413,925 B2
(45) Date of Patent: Sep. 9, 2025

(54) AUDIO PARAMETER OPTIMIZING METHOD AND COMPUTING APPARATUS RELATED TO AUDIO PARAMETERS

(71) Applicant: Acer Incorporated, New Taipei (TW)

(72) Inventors: Po-Jen Tu, New Taipei (TW);
Kai-Meng Tzeng, New Taipei (TW);
Jia-Ren Chang, New Taipei (TW);
Chien-Chung Chen, New Taipei (TW);
Ming-Chun Yu, New Taipei (TW);
Feng-Ming Liu, New Taipei (TW);
Hung-Lun Lu, New Taipei (TW)

(73) Assignee: Acer Incorporated, New Taipei (TW)

( * ) Notice: Subject to any disclaimer, the term of this patent is extended or adjusted under 35 U.S.C. 154(b) by 259 days.

(21) Appl. No.: 18/347,573

(22) Filed: Jul. 6, 2023

(65) Prior Publication Data

US 2024/0373187 A1 Nov. 7, 2024

(30) Foreign Application Priority Data

May 5, 2023 (TW) .................................. 112116774

(51) Int. Cl.
 *H04S 7/00* (2006.01)
 *G10L 19/008* (2013.01)
(52) U.S. Cl.
 CPC ............ *H04S 7/301* (2013.01); *G10L 19/008* (2013.01); *H04S 2420/01* (2013.01)

(58) Field of Classification Search
 CPC ..... H04S 7/301; H04S 2420/01; G10L 19/008
 See application file for complete search history.

(56) References Cited

U.S. PATENT DOCUMENTS

| 11,176,958 B2* | 11/2021 | Bharitkar | ............... H03G 9/005 |
| 2019/0146479 A1 | 5/2019 | Cella et al. | |
| 2024/0373183 A1* | 11/2024 | Tu | .......................... G10L 19/008 |
| 2025/0037729 A1* | 1/2025 | Sun | ..................... G10L 21/0232 |

FOREIGN PATENT DOCUMENTS

| CN | 112567317 | 3/2021 |
| CN | 113614684 | 11/2021 |
| CN | 114822573 | 7/2022 |
| CN | 115171632 | 10/2022 |
| TW | 493161 | 7/2002 |
| TW | 202022852 | 6/2020 |

\* cited by examiner

*Primary Examiner* — David L Ton
(74) *Attorney, Agent, or Firm* — JCIPRNET

(57) ABSTRACT

An audio parameter optimizing method and a computing apparatus related to audio parameters. In the method, sound features of multiple sound signals are obtained. A wide dynamic range compression (WDRC) parameter corresponding to each of the sound signals is determined. Multiple data sets including the sound features and the corresponding WDRC parameters of the sound signals are created. The data sets are used to train a neural network, so as to generate a parameter inference model. The parameter inference model is configured to determine the WDRC parameter of a to-be-evaluated signal. Accordingly, a proper parameter could be provided.

15 Claims, 10 Drawing Sheets

AUDIO PARAMETER OPTIMIZING METHOD AND COMPUTING APPARATUS RELATED TO AUDIO PARAMETERS

CROSS-REFERENCE TO RELATED APPLICATION

This application claims the priority benefit of Taiwan application serial no. 112116774, filed on May 5, 2023. The entirety of the above-mentioned patent application is hereby incorporated by reference herein and made a part of this specification.

BACKGROUND

Technical Field

The disclosure relates to sound signal processing, and more particularly to an audio parameter optimizing method and a computing apparatus related to audio parameters.

Description of Related Art

After connected to a smart speaker system, a mobile device may transmit audio signals to the smart speaker. The smart speaker decodes the audio signals and processes the sound effects, and then music may be played.

It is worth noting that audio adjustments of an audio system are usually targeted at the sound parts that a user would like to enhance. However, different audio sources may have different sound characteristics. Therefore, a single audio adjustment is not applicable to all audio signals.

SUMMARY

The embodiment of the disclosure provides an audio parameter optimizing method and a computing apparatus related to audio parameters, and provides a proper audio parameter.

The audio parameter optimizing method of the embodiment of the disclosure includes (but is not limited to) the following steps: sound features of multiple sound signals are obtained; a wide dynamic range compression (WDRC) parameter corresponding to each of the sound signals is determined; multiple data sets including the sound features and the corresponding WDRC parameters of the sound signals are created; and the data sets are used to train a neural network to generate a parameter inference model, and the parameter inference model is configured to determine a WDRC parameter of a to-be-evaluated signal.

The computing apparatus related to the audio parameters in the embodiment of the disclosure includes (but is not limited to) a storage device and a processor. The storage device is configured to store a program code. The processor is coupled to the storage device. The processor is configured to load the program code to execute: obtaining sound features of multiple sound signals; determining a wide dynamic range compression (WDRC) parameter corresponding to each of the sound signals; creating multiple data sets including the sound features and the corresponding WDRC parameters of the sound signals; and using the data sets to train a neural network to generate a parameter inference model, in which the parameter inference model is configured to determine a WDRC parameter of a to-be-evaluated signal.

Based on the above, the audio parameter optimizing method and the computing apparatus related to the audio parameters according to the embodiments of the disclosure may train the parameter inference model based on the sound features and the corresponding parameters. In this way, a proper WDRC may be provided through the parameter inference model.

In order to make the aforementioned features and advantages of the disclosure comprehensible, embodiments accompanied with drawings are described in detail as follows.

DESCRIPTION OF THE EMBODIMENTS

Figure 1:
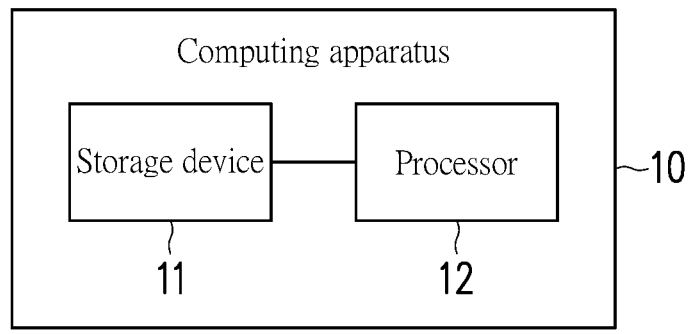
FIG. 1 is an element block diagram of a computing apparatus according to an embodiment of the disclosure.

FIG. 1 is an element block diagram of a computing apparatus 10 according to an embodiment of the disclosure. Referring to FIG. 1, the computing apparatus 10 includes (but is not limited to) a storage device 11 and a processor 12. The computing apparatus 10 may be a desktop computer, a notebook computer, an AIO computer, a smart phone, a tablet computer, a smart speaker, a smart assistant apparatus, a server, or other electronic apparatuses.

The storage device 11 may be any type of fixed or removable random access memory (RAM), read only memory (ROM), flash memory, conventional hard disk drive (HDD), solid-state drive (SSD) or similar elements. In an embodiment, the storage device 11 is configured to record program codes, software modules, configurations, data, or files (e.g., sound signals, sound features, data sets and model parameters), which is to be described in detail in subsequent embodiments.

The processor 12 is coupled to the storage device 11. The processor 12 may be a central processing unit (CPU), a graphic processing unit (GPU), or other programmable general purpose or special purpose microprocessors, a digital signal processor (DSP), a programmable controller, a field programmable gate array (FPGA), an application-specific integrated circuit (ASIC), a neural network accelerator or other similar elements, or combinations of the above elements. In an embodiment, the processor 12 is configured to perform all or part of the operations of the computing apparatus 10 and may load and execute software modules, files and/or data stored in the storage device 11. In some embodiments, the functionality of the processor 12 may be implemented through software.

Hereinafter, the method described in the embodiment of the disclosure is to be described with various elements, modules and signals in the computing apparatus 10. Each process of the method may be adjusted accordingly according to the implementation situation, and is not limited thereto.

Figure 2:
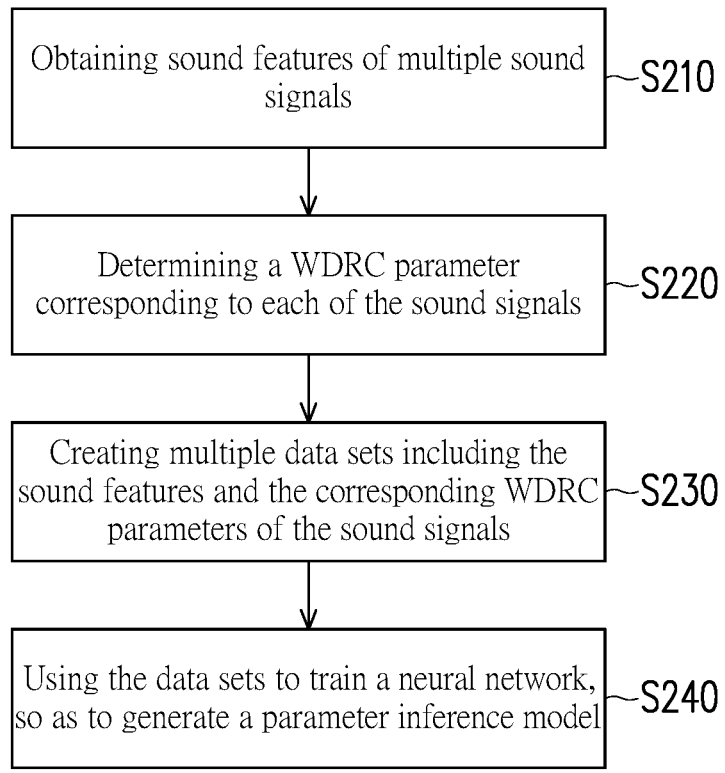
FIG. 2 is a flowchart of an audio parameter optimizing method according to an embodiment of the disclosure.

FIG. 2 is a flowchart of an audio parameter optimizing method according to an embodiment of the disclosure. Referring to FIG. 2, the processor 12 obtains sound features of multiple sound signals (step S210). Specifically, these sound signals may be speech, music, animal sounds, environmental sounds, machine operation sounds, synthetic sounds, or combinations thereof. In an embodiment, the sound features include peak values, the maximum root mean square (RMS) power, the minimum RMS power, average RMS power and/or spectral characteristics (e.g., low, medium and/or high frequencies). However, the types of sound features further have other variations depending on different design requirements, for example, zero crossing rate (ZCR), spectral centroid, spectral rolloff, or Mel frequency cepstral coefficients (MFCCs). The processor 12 may obtain sound features through a function or a feature extractor corresponding to each of the sound features.

The processor 12 may determine the wide dynamic range compression (WDRC) parameter corresponding to each of the sound signals (step S220). Specifically, the WDRC may adjust the output power according to the changes in the input power of the sound signal, and accordingly is applicable to a specific or limited hearing dynamic range. However, different sound signals have different crest factors (the peak value of the waveform divided by the root mean square of the waveform), further making a single WDRC parameter unable to be applicable to all sound signals. In an embodiment, the WDRC parameter is the correspondence between input power and output power. For example, the input power of −10 decibels (dB) corresponds to the output power of −8 dB. The correspondence may be represented or recorded through a lookup table or a conversion function.

In an embodiment, in response to a first signal of the obtained sound signals being configured for music listening, the processor 12 may determine the WDRC parameter thereof according to the maximum RMS and average RMS of the first signal. Configured for music listening may mean that the first signal is music, or it is expected to play the first signal through home audio, smart speakers, or headphones. The determination of the WDRC parameter, for example, is that the processor 12 regards the power range between the maximum RMS and average RMS of input power as an important range and amplifies the output power corresponding to the important range accordingly. It is assumed that the ratio of the input power to the corresponding output power in the original WDRC parameter is 1:1. For the aforementioned important range, the processor 12 may adjust the ratio of the input power to the corresponding output power in the WDRC parameter to (for example) 1:1.2~1~5, but not limited thereto, and the upper limit of the output power is 0 dB.

Figure 3A:
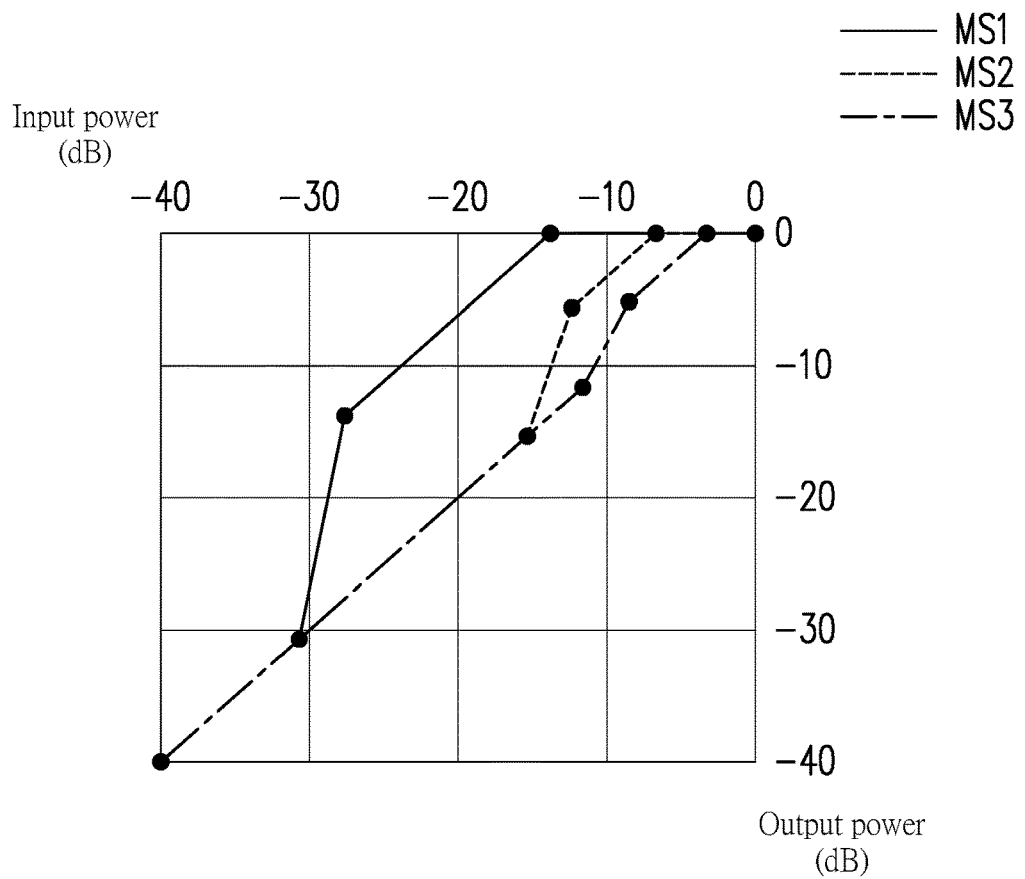
FIG. 3A is a schematic diagram illustrating the parameter definitions of different pieces of music according to an embodiment of the disclosure.

For example, FIG. 3A is a schematic diagram illustrating the parameter definitions of different pieces of music according to an embodiment of the disclosure, and Table (1) shows the maximum RMS and average RMS of sound signals MS1, MS2 and MS3 for three pieces of music. Please refer to FIG. 3A and Table (1). For the sound signal MS1, the output power in the power range between −30.725 dB and −13.92 dB is amplified. For the sound signal MS2, the output power in the power range between −15.505 dB and −6.83 dB is amplified. For the sound signal MS3, the output power in the power range between −11.645 dB and −3.38 dB is amplified. The output power in these power ranges may be maintained equal to the input power.

TABLE 1

|  | Maximum RMS (dB) | Average RMS (dB) |
| --- | --- | --- |
| MS1 | −13.92 | −30.725 |
| MS2 | −6.83 | −15.505 |
| MS3 | −3.38 | −11.645 |

In an embodiment, in response to a second signal of the obtained sound signals being configured for assisted hearing, the processor 12 may amplify a part of the middle section of input power of the WDRC parameter thereof. Configured for assisted hearing may refer to the anticipation of playing the second signal through a personal sound amplifier product/a hearing aid. Each person's hearing characteristics are slightly different. However, in actual applications, the sound of the volume in the middle section (for example, 40 decibels sound pressure level (dBSPL) ~60dBSPL, but not limited thereto) may amplify the output power according to the user's hearing characteristics and the environmental signal-to-noise ratio. For the middle section (for example, output power is −30 dB~−20 dB, −35 dB~−25 dB or −32 dB~−20 dB), the processor 12 may adjust the ratio of the input power to the corresponding output power in the WDRC parameter to, for example, 1:1.3~1:6, but not limited thereto, and the upper limit of the output power is 0 dB. Moreover, a too loud sound (e.g., the volume thereof is greater than 60dBSBL) and a too small noise (e.g., the volume thereof is less than 40dBSBL) remain in the original state (e.g., adjusting the ratio of the input power to the corresponding output power in the WDRC parameter to 1:1).

Figure 3B:
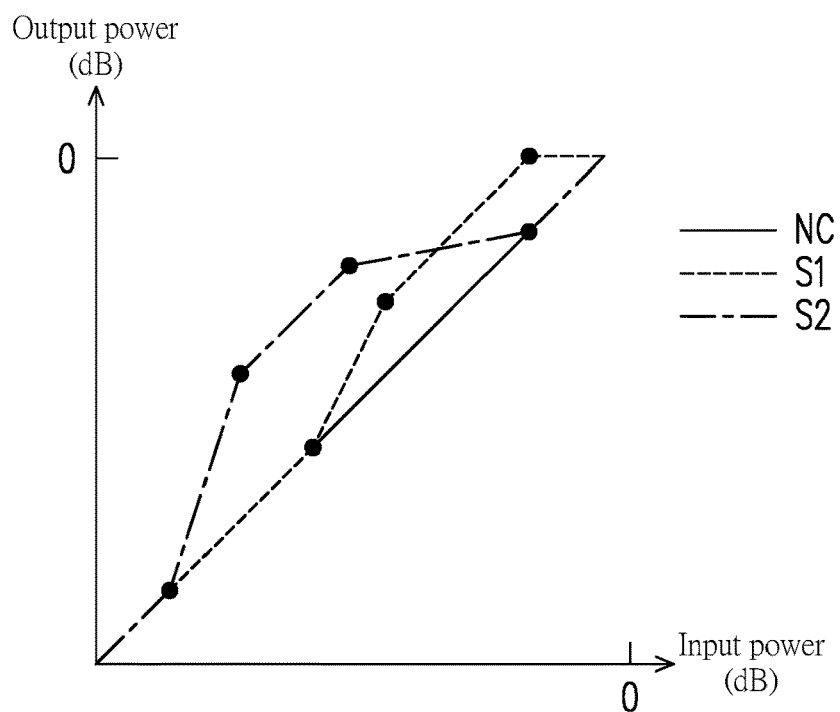
FIG. 3B is a schematic diagram illustrating the parameter definitions of different output applications according to an embodiment of the disclosure.

For example, FIG. 3B is a schematic diagram illustrating the parameter definitions of different output applications according to an embodiment of the disclosure. Referring to FIG. 3B, in which the ratio of the input power to the corresponding output power in an unadjusted WDRC parameter NC is 1:1. The enhanced portions for a WDRC parameter S1 for music listening and a WDRC parameter S2 for assisted hearing may be different. Here, enhancement refers to the value of the output power being greater than the value of the corresponding input power.

It should be noted that the sound signal may further be configured for other output applications or originate from other sources, and the portions the sound signal would like to enhance (for example, the value of the output power is greater than the value of the corresponding input power) or reduce (for example, the value of the output power is less than the value of the corresponding input power) may vary.

Referring to FIG. 2, the processor 12 may create multiple data sets (step S230) including the sound features and the corresponding WDRC parameters of the received sound signals. Specifically, each of the data sets includes one or more data samples, and each of the data samples includes a sound feature and a corresponding WDRC parameter of a sound signal. In some embodiments, the processor 12 may assign multiple data sets as training sets, validation sets or test sets for use in different stages of subsequent model construction. For example, the training set is a collection of data samples configured to adjust the parameters of the neural network (e.g., the weights of connections between neurons). The validation set provides unbiased evaluation of the model obtained by adjustment on the training set. The test set may be configured to provide the unbiased evaluation of a final model.

The processor 12 may use the created data sets to train a neural network, so as to generate a parameter inference model (step S240). Specifically, the neural network is an important topic in artificial intelligence (AI) and makes decisions by simulating the operation of human brain cells.

It is worth noting that many neurons exist in human brain cells, and these neurons are interconnected through synapses. Moreover, each neuron may receive signals through synapses, and the output of the transformed signals is transmitted to another neuron. The transformation capability of each neuron is different, and humans may form thinking and judgment capabilities through the aforementioned operations of signal transmission and transformation. The neural network obtains the corresponding capabilities according to the aforementioned operation methods. In the operation of each neuron, the input component is multiplied by the corresponding synaptic weight (possibly with bias), and is outputted through a nonlinear function (for example, an activation function), thereby extracting features.

The parameter inference model is trained and learns the relationship between sound data and WDRC parameters. A neural network-related algorithm includes, for example, a convolutional neural network (CNN), a recurrent neural network (RNN), a multilayer perceptron, a generative adversarial network (GAN), an XGBoost regressor, or other machine learning algorithms. The neural network-related algorithm may analyze the parameter inference model, and according to labeled samples (e.g., sound features of determined WDRC parameters), establish the association between the nodes in the hidden layer between the sound signals/sound features (i.e., the input of the model) and the WDRC parameters (i.e., the output of the model). A parameter learning model is the constructed model after learning and may be configured to infer to-be-evaluated data (e.g., sound signals/sound features to be evaluated) to determine a WDRC parameter of a to-be-evaluated signal.

In an embodiment, the processor 12 may define at least one of the output upper limit and the output lower limit of the parameter inference model. The output upper limit refers to the upper limit of the output power corresponding to each input power in the outputted WDRC parameters, and the output lower limit refers to the lower limit of the output power corresponding to each input power in the outputted WDRC parameters. Defining a suitable WDRC range according to experience (i.e., between the output upper limit and the output lower limit) may prevent outlier effects caused by using special sound signals for training (for example, 2.5% of data distribution near the boundary).

Figure 4:
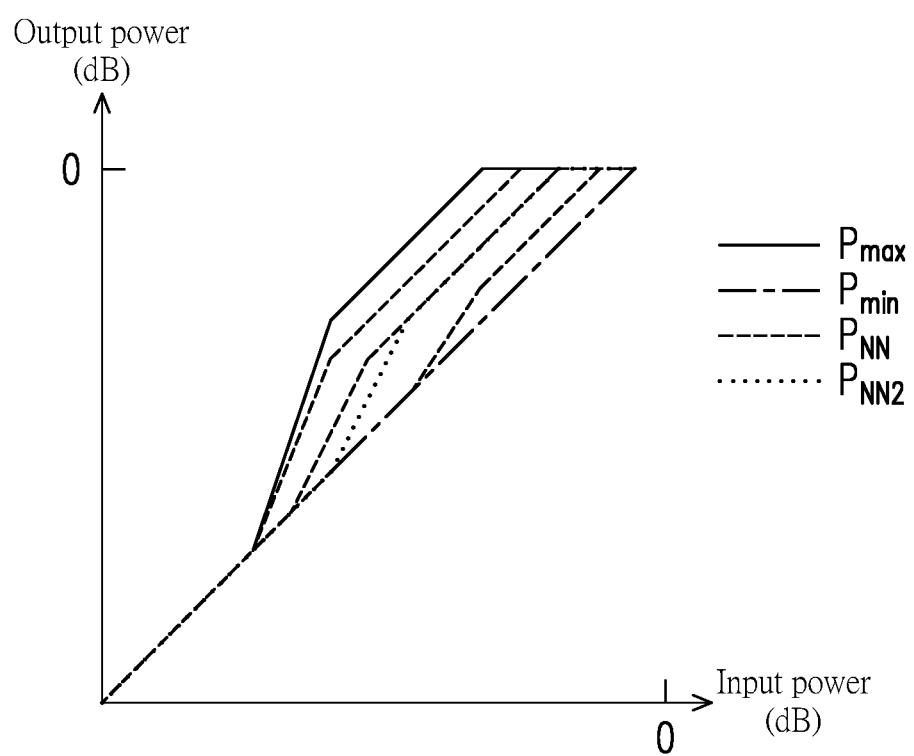
FIG. 4 is a schematic diagram illustrating the upper and lower limits of parameters according to an embodiment of the disclosure.

For example, FIG. 4 is a schematic diagram illustrating the upper and lower limits of parameters according to an embodiment of the disclosure. Referring to FIG. 4, for example, the output power corresponding to each input power in WDRC parameters $P_{NN}$ and $P_{NN2}$ outputted by the parameter inference model is not greater than an output upper limit $P_{max}$, and is not less than an output lower limit $P_{min}$, that is, between the output upper limit $P_{max}$ and the output lower limit $P_{min}$.

In an embodiment, the created data sets include a first set and a second set. In the first stage of training of the neural network, the processor 12 may use the first set as the training set and the second set as the validation set. In the second stage of training of the neural network, the processor 12 uses the second set as the training set and the first set as the validation set. Cross-validation (also known as cyclic estimation) involves analyzing a portion of the data sets and using other data sets for subsequent confirmation and validation of the analysis. The initial data sets used for analysis are referred to as the training sets. The other data sets are referred to as the validation sets or test sets. One object of cross-validation is to test the performance of a model using new data that has not been configured for training, in order to reduce problems such as overfitting and selection bias. The cross-validation is, for example, K-Fold cross-validation, Holdout validation, or Leave-One-Out Cross-validation (LOOC).

Figure 5A:
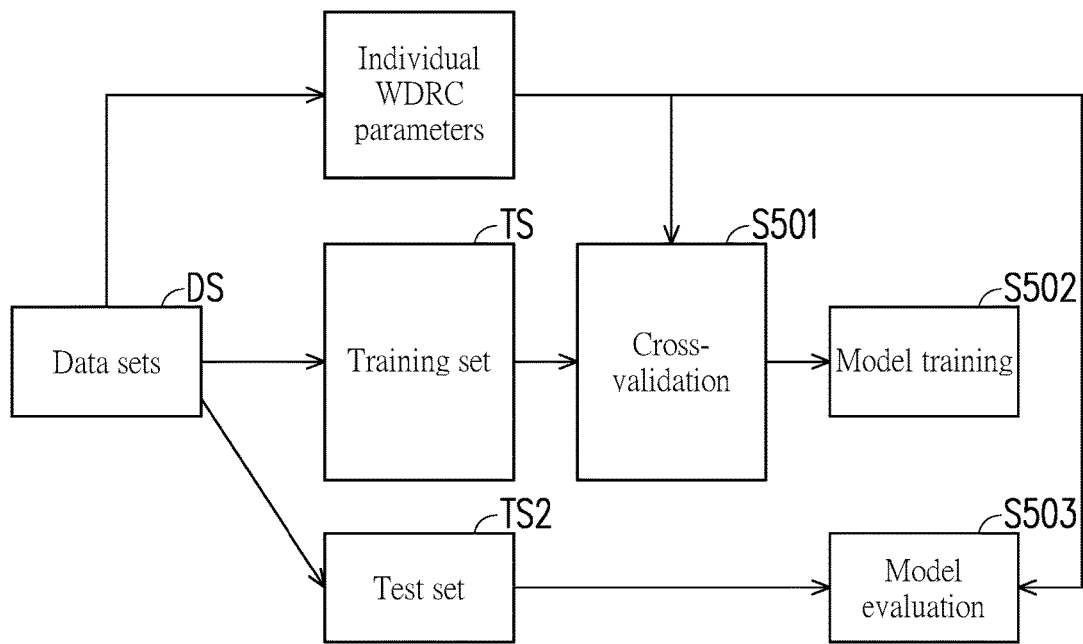
FIG. 5A is a schematic diagram of data set allocation according to an embodiment of the disclosure.

For example, FIG. 5A is a schematic diagram of data set allocation according to an embodiment of the disclosure. Referring to FIG. 5A, the processor 12 may assign multiple data sets DS as a training set TS and a test set TS2, respectively.

Figure 5B:
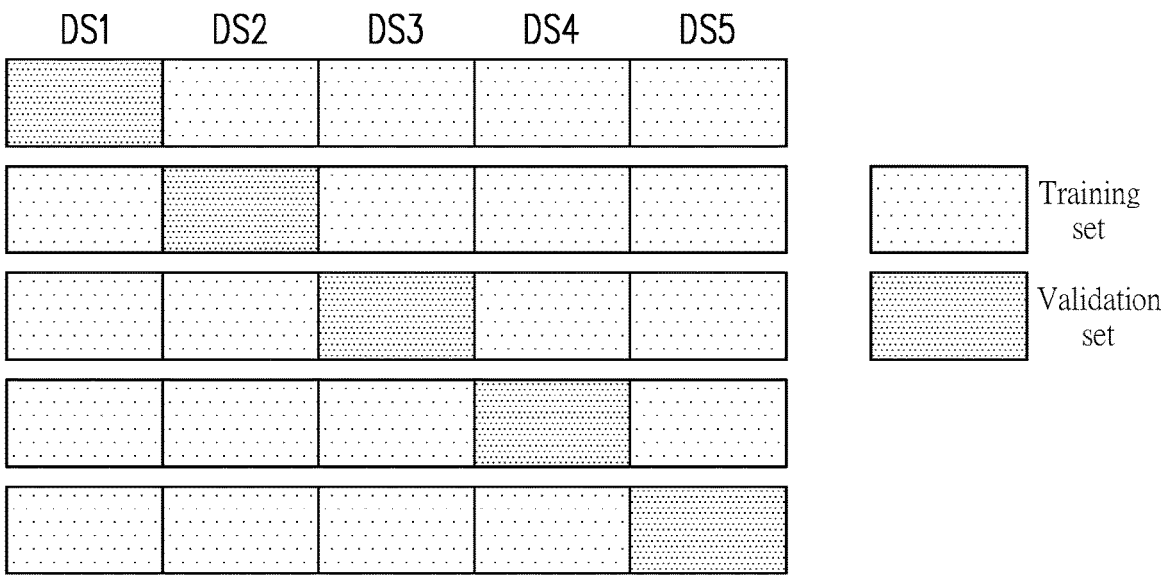
FIG. 5B is a schematic diagram of cross-validation according to an embodiment of the disclosure.

FIG. 5B is a schematic diagram of cross-validation (step S501) according to an embodiment of the disclosure. Referring to FIGS. 5A and 5B, taking K-fold cross-validation as an example, where each row represents a stage. In the first stage, a data set DS1 (including individual WDRC parameters) in the original training set TS is used as the training set, the other data sets DS2~DS5 (including individual WDRC parameters) in the original training set TS are used as the validation set, and accordingly, the parameter inference model (neural network) is trained (step S502). In the second stage, the data set DS2 (including individual WDRC parameters) in the original training set TS is used as the training set, the other data sets DS1 and DS3~DS5 (including individual WDRC parameters) in the original training set TS are used as the validation set, and accordingly, the parameter inference model (neural network) is trained (step S502). In the third stage, the data set DS3 (including individual WDRC parameters) in the original training set TS is used as the training set, the other data sets DS1, DS2, DS4 and DS5 (including individual WDRC parameters) in the original training set TS are used as the validation set, and accordingly, the parameter inference model (neural network) is trained (step S502). The rest may be deduced similarly, and the descriptions are not repeated here. The average of the errors obtained in all stages may be used as an error reference for model training. Next, evaluation of the trained parameter inference model may be performed by using the test set TS2 (step S503).

Referring to FIG. 4, the WDRC parameter $P_{NN}$ is the corresponding parameter for multiple pieces of music obtained without cross-validation, and the WDRC parameter $P_{NN2}$ is the corresponding parameter for multiple pieces of music obtained with cross-validation. In this way, sound signals with the same application requirements or from the same source may be integrated into a single or relatively similar WDRC parameter.

Figure 6:
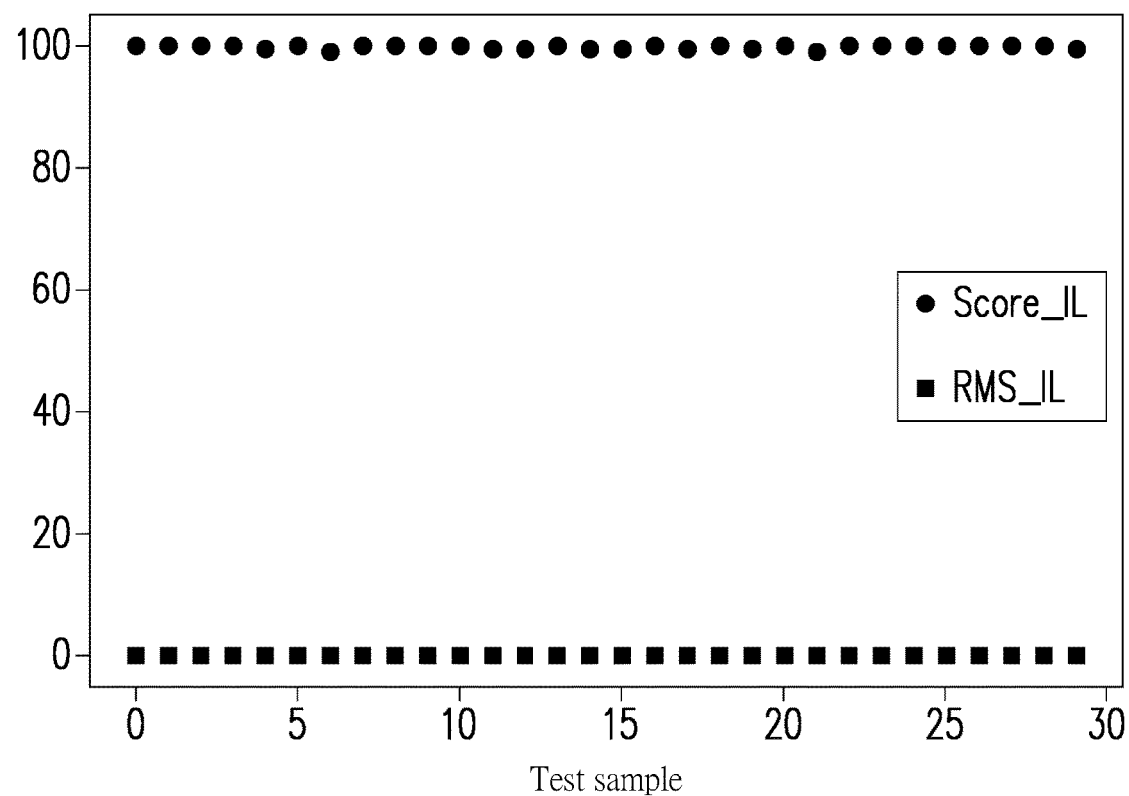
FIG. 6 is a schematic diagram of experimental results of a parameter inference model according to an embodiment of the disclosure.
Figure 7A:
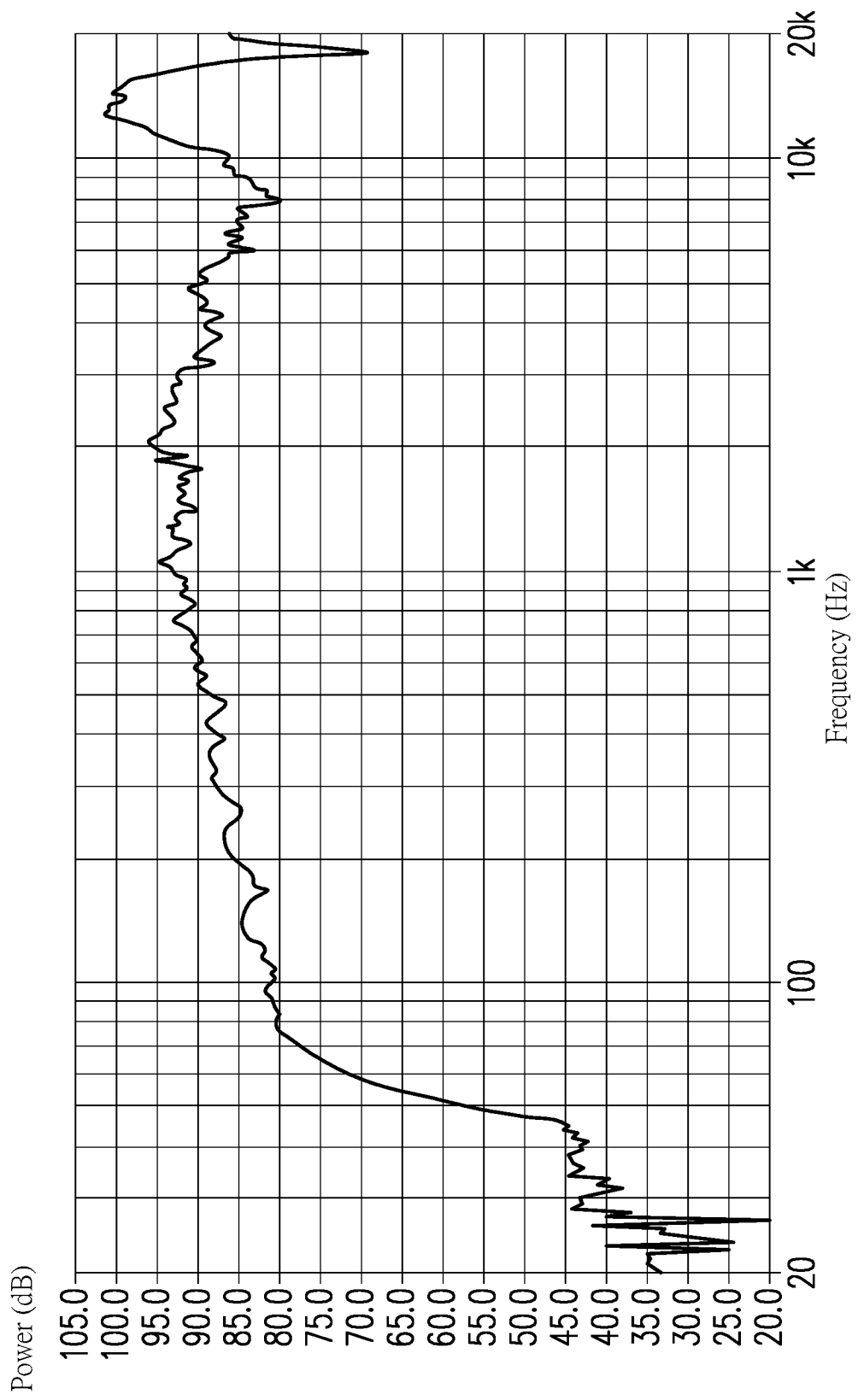
FIGS. 7A to 7E are schematic diagrams of experimental results for multiple input power according to an embodiment of the disclosure.
Figure 7B:
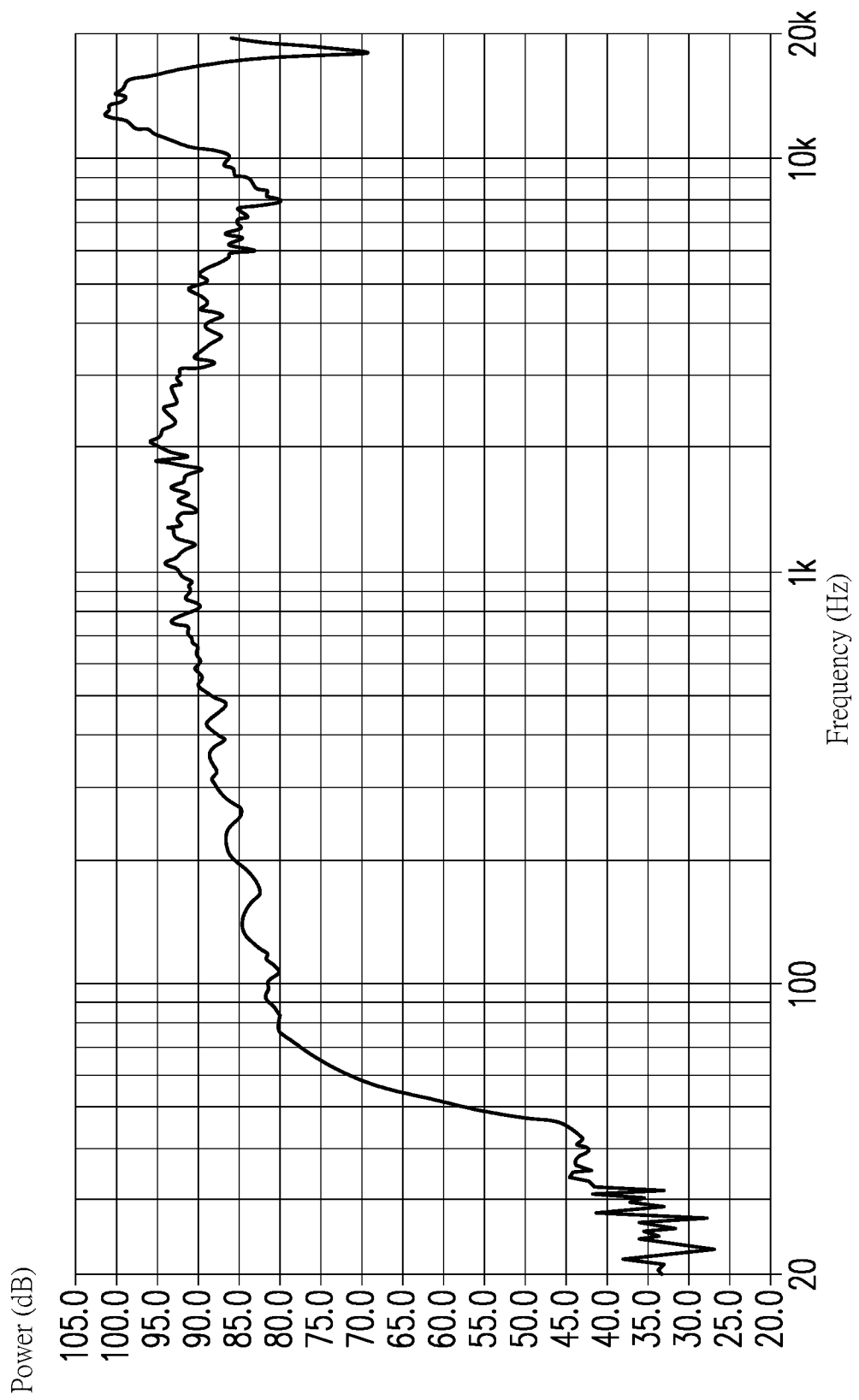
Figure 7C:
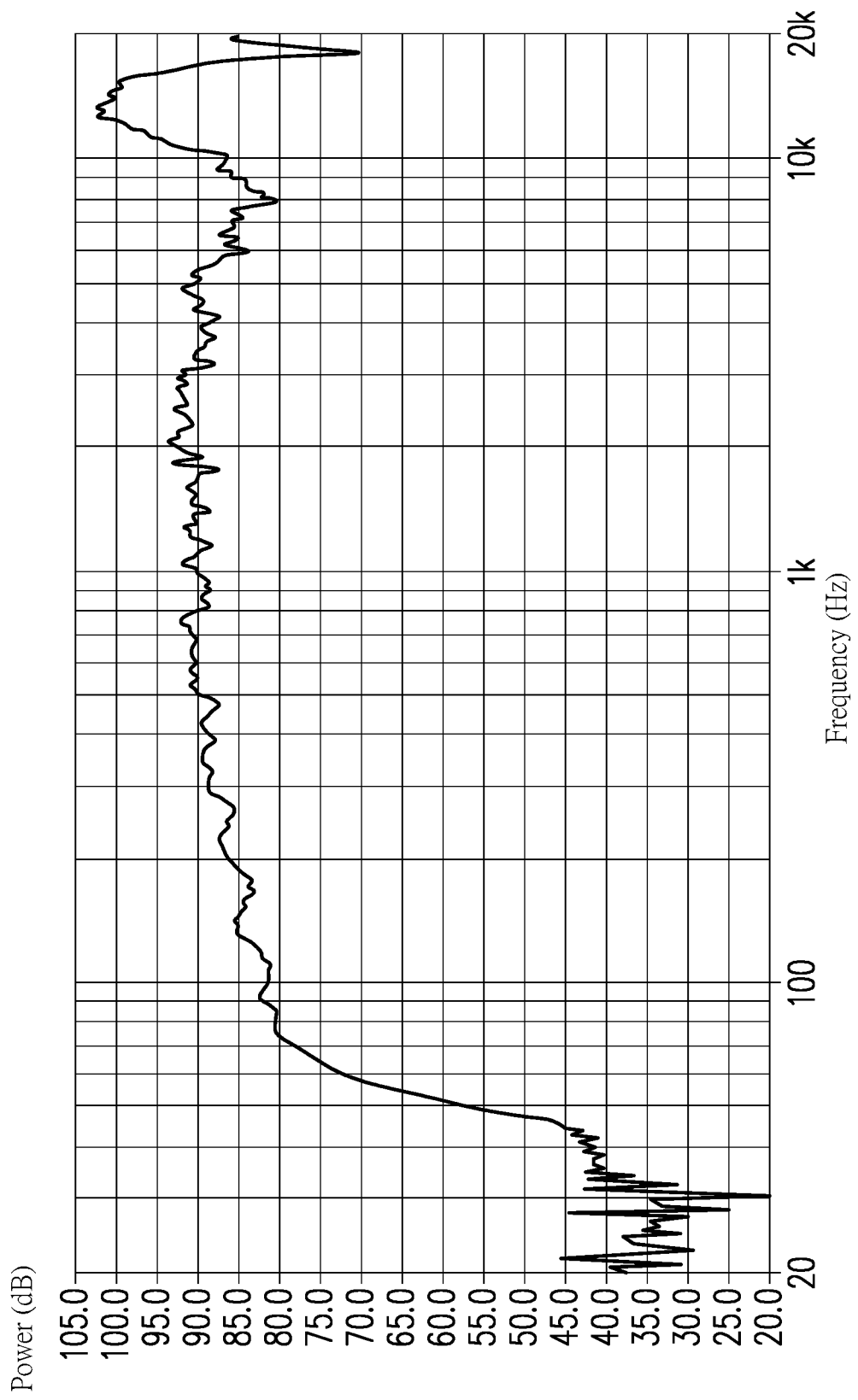
Figure 7D:
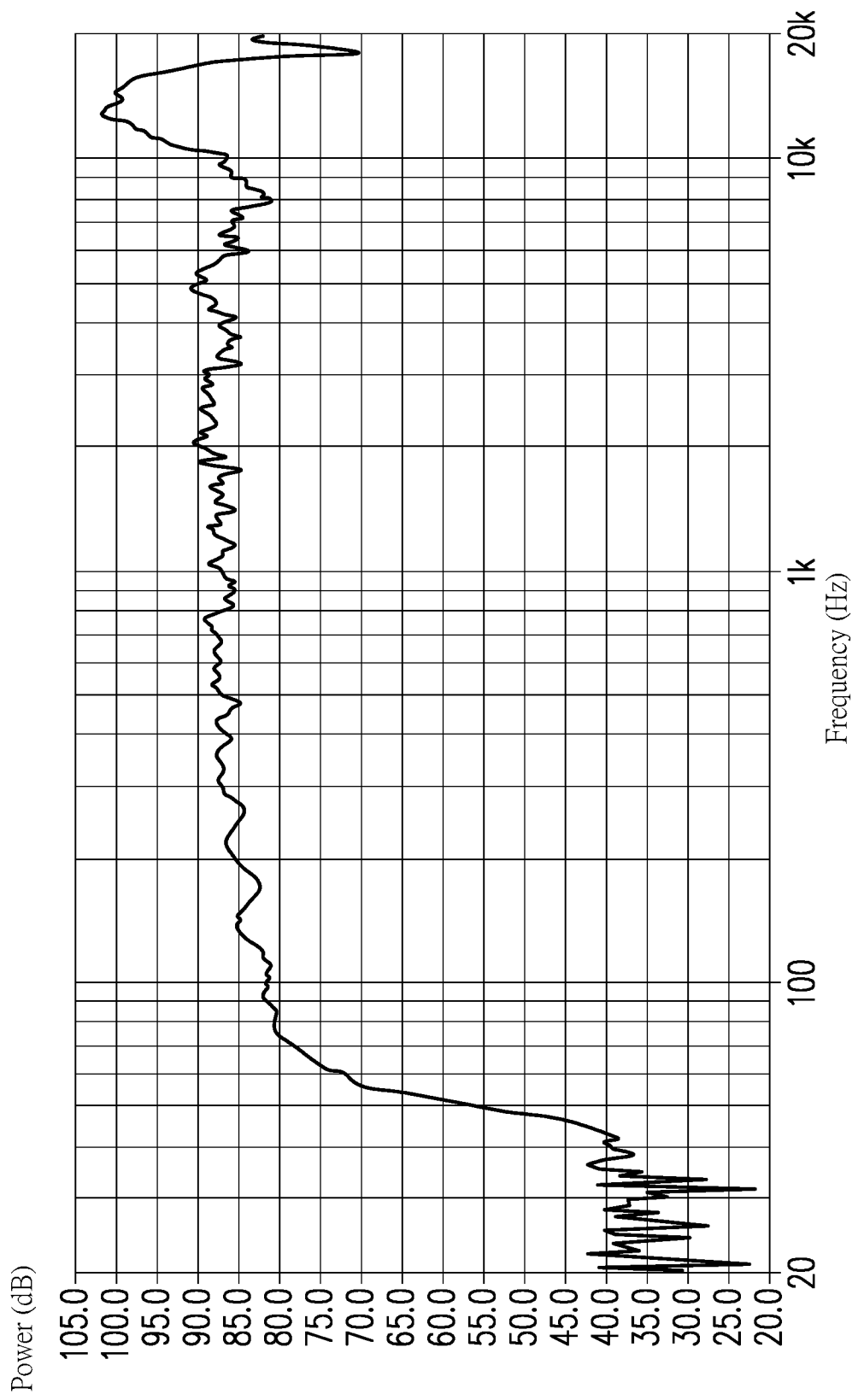
Figure 7E:
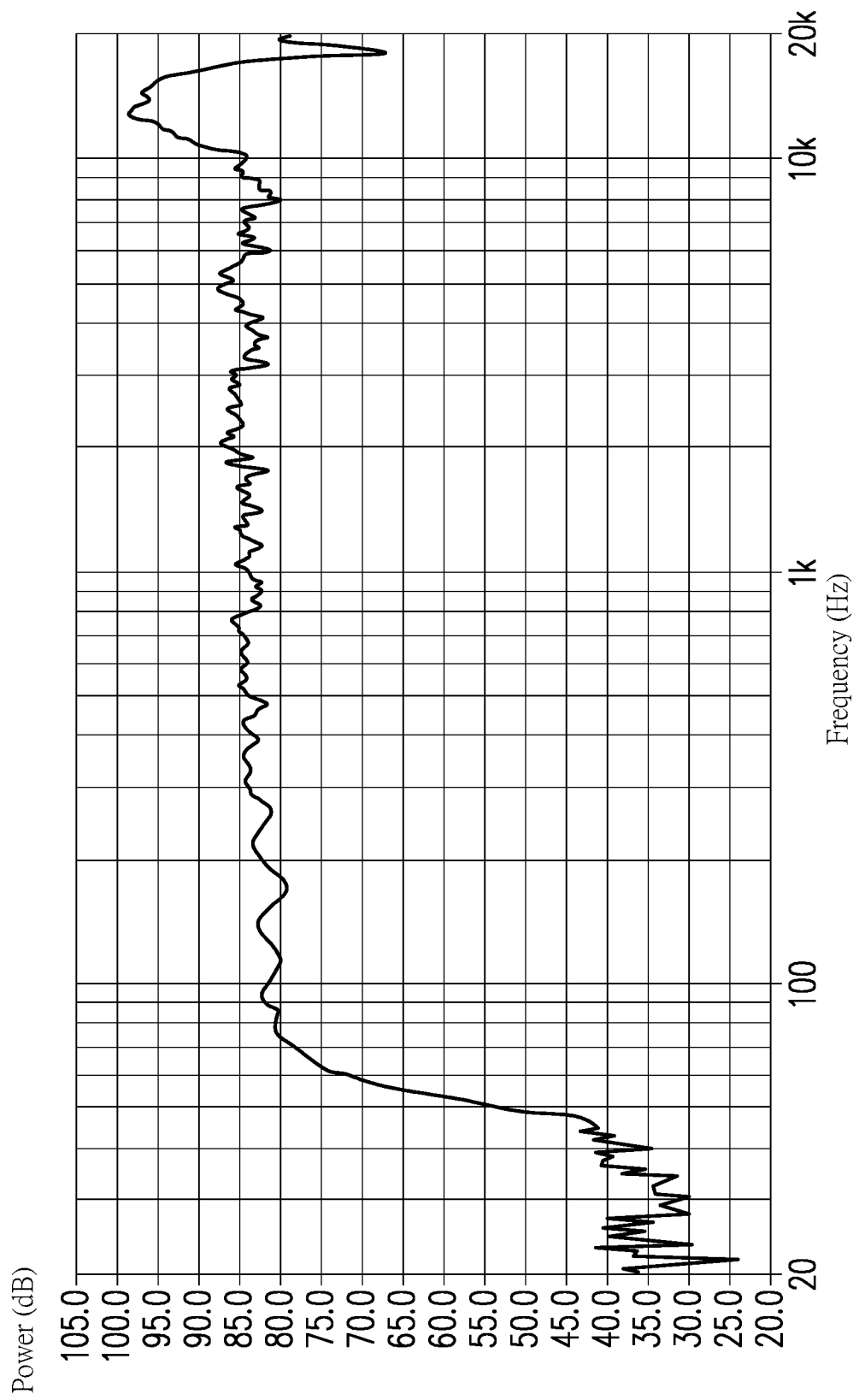

FIG. 6 is a schematic diagram of experimental results of a parameter inference model according to an embodiment of the disclosure. Referring to FIG. 6, in the experiment, all data sets include 400 pieces of music, of which 370 pieces of music are used as the training set, and 30 pieces of music are used as the test set. The training set may be exchanged as the training set and the validation set through cross-validation, and accordingly, the parameter inference model is trained. Through the experiment, accuracy Score_IL may approach or be equal to 100%, and a RMS error RMS_IL may approach or be equal to 0.

FIGS. 7A to 7E are schematic diagrams of experimental results for multiple input power according to an embodiment of the disclosure. Please refer to FIGS. 7A to 7E, which respectively are the frequency responses of the input power at 0 dB, −3 dB, −6 dB, −9 dB and −12 dB, and the differences therebetween are quite small.

In summary, in the audio parameter optimizing method and the computing apparatus related to the audio parameters according to the embodiments of the disclosure, sound features are extracted from sound signals, a reference template for WDRC parameters is defined, and a neural network is trained accordingly. The trained parameter inference model may provide proper WDRC parameters for various to-be-evaluated signals.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:

1. An audio parameter optimizing method, comprising:
obtaining sound features of a plurality of sound signals;
determining a wide dynamic range compression (WDRC) parameter corresponding to each of the sound signals;
creating a plurality of data sets comprising the sound features of the sound signals and the WDRC parameters corresponding to the sound signals; and
using the data sets to train a neural network, so as to generate a parameter inference model, wherein the parameter inference model is configured to determine a WDRC parameter of a to-be-evaluated signal.

2. The audio parameter optimizing method according to claim 1, wherein determining the WDRC parameter corresponding to each of the sound signals comprises:
in response to a first signal of the sound signals being configured for music listening, determining a WDRC parameter thereof according to the maximum root mean square (RMS) and average RMS of the first signal.

3. The audio parameter optimizing method according to claim 2, further comprising:
amplifying output power corresponding to a power range between the maximum RMS and average RMS of input power in the WDRC parameter.

4. The audio parameter optimizing method according to claim 1, wherein determining the WDRC parameter corresponding to each of the sound signals comprises:
in response to a second signal of the sound signals being configured for assisted hearing, amplifying a part of a middle section of input power of a WDRC parameter thereof.

5. The audio parameter optimizing method according to claim 4, further comprising:
amplifying output power corresponding to the middle section of input power in the WDRC parameter.

6. The audio parameter optimizing method according to claim 1, wherein the sound features of the sound signal comprise at least one of a peak value, the maximum RMS power, the minimum RMS power, average RMS power and a spectral characteristic.

7. The audio parameter optimizing method according to claim 1, wherein using the data sets to train the neural network comprises:
defining at least one of an output upper limit and an output lower limit of the parameter inference model.

8. The audio parameter optimizing method according to claim 1, wherein the data sets comprise a first set and a second set, and using the data sets to train the neural network comprises:
in a first stage of training of the neural network, using the first set as a training set and the second set as a validation set; and
in a second stage of training of the neural network, using the second set as the training set and the first set as the validation set.

9. A computing apparatus related to audio parameters, comprising:
a storage device, configured to store a program code; and
a processor, coupled to the storage device, and configured to load the program code to execute:
obtaining sound features of a plurality of sound signals;
determining a wide dynamic range compression (WDRC) parameter corresponding to each of the sound signals;
creating a plurality of data sets comprising the sound features of the sound signals and the WDRC parameters corresponding to the sound signals; and
using the data sets to train a neural network, so as to generate a parameter inference model, wherein the parameter inference model is configured to determine a WDRC parameter of a to-be-evaluated signal.

10. The computing apparatus according to claim 9, wherein the processor is further configured for:
in response to a first signal of the sound signals being configured for music listening, determining a WDRC parameter thereof according to the maximum root mean square (RMS) and average RMS of the first signal; or
in response to a second signal of the sound signals being configured for assisted hearing, amplifying a part of a middle section of input power of a WDRC parameter thereof.

11. The computing apparatus according to claim 10, wherein the processor is further configured for:
amplifying output power corresponding to a power range between the maximum RMS and average RMS of input power in the WDRC parameter.

12. The computing apparatus according to claim 10, wherein the processor is further configured for:
amplifying output power corresponding to the middle section of input power in the WDRC parameter.

13. The computing apparatus according to claim 9, wherein the sound features of the sound signal comprise at least one of a peak value, the maximum RMS power, the minimum RMS power, average RMS power and a spectral characteristic.

14. The computing apparatus according to claim 9, wherein the processor is further configured for:
defining at least one of an output upper limit and an output lower limit of the parameter inference model.

15. The computing apparatus according to claim 9, wherein the data sets comprise a first set and a second set, and the processor is further configured for:
in a first stage of training of the neural network, using the first set as a training set and the second set as a validation set; and
in a second stage of training of the neural network, using the second set as the training set and the first set as the validation set.

* * * * *